(12) United States Patent
Ohnishi et al.

(10) Patent No.: US 7,248,473 B2
(45) Date of Patent: Jul. 24, 2007

(54) PRINTED CIRCUIT BOARD HAVING LARGER SPACE FOR ELECTRONIC COMPONENTS AND CONTRIBUTING TO EFFICIENT COOLING

(75) Inventors: Masuo Ohnishi, Kawasaki (JP); Masumi Suzuki, Kawasaki (JP); Michimasa Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 245 days.

(21) Appl. No.: 10/947,207

(22) Filed: Sep. 23, 2004

(65) Prior Publication Data

US 2005/0207124 A1  Sep. 22, 2005

(30) Foreign Application Priority Data

Mar. 16, 2004  (JP) .............................. 2004-075026

(51) Int. Cl.
*H05K 7/20*  (2006.01)

(52) U.S. Cl. ................. 361/695; 361/715; 361/719

(58) Field of Classification Search ................ 361/687, 361/694–695, 719–720
See application file for complete search history.

(56) References Cited

U.S. PATENT DOCUMENTS 6,519,149 B1  2/2003  Inoue
6,665,181 B2  12/2003 Tanaka et al.
6,724,625 B2  4/2004  Inoue
2003/0053296 A1*  3/2003 Tanaka et al. .............. 361/719

FOREIGN PATENT DOCUMENTS

JP  2001-284863  10/2001
JP  2003-92483  3/2003

* cited by examiner

*Primary Examiner*—Gregory D Thompson
(74) *Attorney, Agent, or Firm*—Westerman, Hattori, Daniels & Adrian, LLP

(57) ABSTRACT

An intake opening is defined in a printed circuit board inside a fan cover mounted on the printed circuit board. The intake opening has a particular extent inside the fan cover. This intake opening contributes to improvement in the cooling efficiency of a fan as compared with a conventional intake opening. Moreover, the intake opening allows a sufficient space to remain on the front and back surfaces of the printed circuit board inside the fan cover. Electronic components and/or wiring patterns may be disposed in the space. This contributes to disposition of electronic components and/or wiring patterns at a higher density on the printed circuit board.

24 Claims, 9 Drawing Sheets

Example(Invention)

Comparative
Example 1

Comparative
Example 2

Comparative
Example 3

Comparative
Example 4

Comparative
Example 5

Comparative
Example 6

Comparative
Example 7

Comparative
Example 8

Comparative
Example 9

Comparative
Example 10

Comparative
Example 11

|  | Example (Invention) | Compara. Example1 | Compara. Example2 | Compara. Example3 |
|---|---|---|---|---|
| Air Volume [m³/min] | 0.093 | 0.088 | 0.085 | 0.087 |
| Static Pressure [Pa] | 185.2 | 207.6 | 179.5 | 195.3 |
| Sound [dB] | 39.8 | 39.8 | - | 39.5 |

FIG.7A

|  | Compara. Example4 | Compara. Example5 | Compara. Example6 | Compara. Example7 |
|---|---|---|---|---|
| Air Volume [m³/min] | 0.093 | 0.093 | 0.095 | 0.075 |
| Static Pressure [Pa] | 176.2 | 209.1 | 188.7 | 195.4 |
| Sound [dB] | 40.4 | 40.0 | - | - |

FIG.7B

|  | Compara. Example8 | Compara. Example9 | Compara. Example10 | Compara. Example11 |
|---|---|---|---|---|
| Air Volume [m³/min] | 0.083 | 0.079 | 0.090 | 0.080 |
| Static Pressure [Pa] | 192.0 | 205.4 | 194.1 | 193.1 |
| Sound [dB] | - | - | 42.7 | - |

FIG.7C

PRINTED CIRCUIT BOARD HAVING LARGER SPACE FOR ELECTRONIC COMPONENTS AND CONTRIBUTING TO EFFICIENT COOLING

BACKGROUND OF THE INVENTION

1. Field of the Invention

The present invention relates to a printed circuit board unit and a fan unit incorporated in an electronic apparatus such as a notebook personal computer, for example. In particular, the invention relates to a fan unit including a fan rotating around the rotation axis, and a fan cover defining an inner space for containing the fan.

2. Description of the Prior Art

A fan unit is in general incorporated within a notebook personal computer as disclosed in Japanese Patent Application Publication No. 2001-284863. The fan unit includes a fan cover for containing a fan rotating around the rotation axis. When the fan rotates, air is forced to flow away from the rotation axis in the centrifugal direction. The fan cover serves to guide the air toward a discharge opening. At the same time, an intake opening is defined in the fan cover. Ambient air is introduced inside the fan cover through the intake opening. Airflow is generated along the surface of the printed circuit board.

In general, many electronic components are mounted on the surface of a printed circuit board. Wiring patterns are formed on the surface of the printed circuit board so as to connect the electronic components. A reduction in the size of the notebook personal computer induces a reduction in the size of the printed circuit board. The electronic components and wiring patterns are located on the printed circuit board at a higher density. The tight location of the electronic components and wiring patterns requires an efficient heat radiation from the printed circuit board. The cooling efficiency of the fan should be improved.

SUMMARY OF THE INVENTION

It is accordingly an object of the present invention to provide an electronic apparatus having a larger space for electronic components and contributing to an efficient cooling. It is also an object of the present invention to provide a printed circuit board unit and fan unit greatly contributing to realization of the electronic apparatus.

According to a first aspect of the present invention, there is provided a printed circuit board unit comprising: a printed circuit board; a fan rotating about the rotation axis intersecting the surface of the printed circuit board; a fan cover mounted on the printed circuit board, said fan cover defining an inner space for containing the fan; a discharge opening defined in the fan cover at a location outside the fan in the centrifugal direction; a curved wall defined in the fan cover, said curved wall extending on the printed circuit board along an outer periphery of the fan; and a guiding wall defined in the fan cover, said guiding wall extending on the printed circuit board along a plane from the downstream end of the curved wall toward the discharge opening, wherein an intake opening extends in the printed circuit board from a first reference plane to a fourth reference plane across second and third reference planes, where the first reference plane extends from the rotation axis to the guiding wall in the direction perpendicular to the guiding wall, the second reference plane located downstream of the first reference plane and perpendicularly intersecting the first reference plane at the rotation axis, the third reference plane located downstream of the second reference plane and perpendicularly intersecting the second reference plane at the rotation axis, and the fourth reference plane located downstream of the third reference plane and perpendicularly intersecting the third reference plane at the rotation axis.

The fan rotates around the rotation axis in the printed circuit board unit. The rotating fan serves to generate a high speed airflow within the inner space of the fan cover. Air is sucked into the inner space of the fan cover through the intake opening defined in the printed circuit board. Airflow is thus generated along the front and back surfaces of the printed circuit board. The airflow serves to efficiently absorb heat from the front and back surfaces of the printed circuit board. The rotating fan also forces the sucked air to flow within the fan cover. The curved wall and the guiding wall serve to guide the air toward the discharge opening. The air is allowed to flow out of the fan cover through the discharge opening. The heat radiation is thus promoted from the printed circuit board.

The intake opening extends from the first reference plane to the fourth reference plane across the second and third reference planes in the printed circuit board unit. According to an examination of the inventors, it has been proved that the intake opening contributes to improvement in the cooling efficiency of the fan as compared with a conventional intake opening. Moreover, a sufficient space can be maintained on the front and back surfaces of the printed circuit board between the fourth and first reference planes. Electronic components and/or wiring patterns may be disposed in the space, for example. This contributes to disposition of electronic components and/or wiring patterns at a higher density on the printed circuit board.

The printed circuit board may include: a central portion extending around the rotation axis of the fan inside the intake opening; and an area extending from the central portion to the curved wall in an extent from the fourth reference plane to the first reference plane, said area excluding the intake opening. Electronic components and/or wiring patterns can be positioned within the central portion as well as the aforementioned area excluding the intake opening. The aforementioned area may be opposed to a space occupied at least by blades of the fan rotating around the rotation axis in an extent from the fourth reference plane to the first reference plane without interruption. The printed circuit board unit may be incorporated within an electronic apparatus such as a notebook personal computer, for example.

The intake opening may comprise: a first intake opening or separate component defined in the printed circuit board between first and second reference planes; a second intake opening or separate component defined in the printed circuit board between third and the second reference planes; and a third intake opening or separate component defined in the printed circuit board between fourth and the third reference planes.

According to a second aspect of the present invention, there is provided a fan unit comprising: a bottom plate; a fan rotating about the rotation axis intersecting the surface of the bottom plate; a fan cover coupled to the bottom plate, said fan cover defining an inner space for containing the fan; a discharge opening defined in the fan cover at a location outside the fan in the centrifugal direction; a curved wall defined in the fan cover, said curved wall extending on the bottom plate along the outer periphery of the fan; and a guiding wall defined in the fan cover, said guiding wall extending on the bottom plate along a plane from the downstream end of the curved wall toward the discharge opening, wherein an intake opening extends in the bottom plate from a first reference plane to a fourth reference plane across second and third reference planes, where the first reference plane extends from the rotation axis to the guiding wall in a direction perpendicular to the guiding wall, the second reference plane located downstream of the first reference plane and perpendicularly intersecting the first reference plane at the rotation axis, the third reference plane located downstream of the second reference plane and perpendicularly intersecting the second reference plane at the rotation axis, and the fourth reference plane located downstream of the third reference plane and perpendicularly intersecting the third reference plane at the rotation axis.

The fan unit serves to improve the cooling efficiency of the fan as described above. If the fan unit is mounted no the printed circuit board within an electronic apparatus, for example, the heat radiation can be promoted in the printed circuit board.

The bottom plate may include: a central portion extending around the rotation axis of the fan; and an area extending from the central portion to the curved wall in an extent from the fourth reference plane to the first reference plane, said area excluding the intake opening. The area may be opposed to a space occupied at least by blades of the fan rotating around the rotation axis in an extent from the fourth reference plane to the first reference plane without interruption.

The intake opening may comprise: a first intake opening or separate component defined in the printed circuit board between first and second reference planes; a second intake opening or separate component defined in the printed circuit board between third and the second reference planes; and a third intake opening or separate component defined in the printed circuit board between fourth and the third reference planes.

According to a third aspect of the present invention, there is provided a printed circuit board comprising an intake opening for a fan unit, said intake opening located at a position where the fan unit is mounted, said intake opening being defined within an area located on a discharge side of the fan unit, said area being divided into a pair of portions with a reference line extending through a rotation axis of a fan in the fan unit in the direction of discharge of the fan unit, and said intake opening further being defined in a portion located within an area opposite to the discharge side at a position upstream of the reference line according to the direction of rotation of the fan.

According to a fourth aspect of the present invention, there is provided a printed circuit board unit including a printed circuit board as defined in the third aspect of the present invention and a fan unit. In this case, the fan unit may include a fan rotating around the rotation axis intersecting the surface of the printed circuit board, and a discharge opening located outside the fan in the centrifugal direction.

The intake opening may include three separate components. Two of the components may respectively be located in the portions on the discharge side of the fan unit. The other of the components may be located in the portion within the area opposite to the discharge side with respect to the reference line.

Said two of the components may respectively be shaped into a near sector. The near sector may have a contour along a first circle having the center at the rotation axis of the fan. The other of the components may be shaped into a near sector. This near sector may have a contour along a second circle concentric to the first circle and having a diameter different from that of the first circle.

The fan unit may comprise a fan cover including an intake opening having the center at the rotation axis of the fan and a diameter identical to that of the first circle. The outer diameter of the intake opening in the printed circuit board corresponds to the outer diameter of the intake opening in the fan cover. This avoids a discharge of air out of one of the intake openings due to the difference of the areas of the intake openings. Air is efficiently sucked and discharged.

The aforementioned printed circuit board and printed circuit board unit serve to improve the cooling efficiency of the fan as described above. Moreover, the printed circuit board includes an area, excluding any intake opening, opposite to the discharge side of the fan unit at a position upstream of the reference line. A sufficient space can be maintained on the front and back surfaces of the printed circuit board. Electronic components and/or wiring patterns may be disposed in the space, for example. This contributes to disposition of electronic components and/or wiring patterns at a higher density on the printed circuit board.

According to a fifth aspect of the present invention, there is provided a fan unit comprising: a bottom plate: a fan rotating about a rotation axis intersecting a surface of the bottom plate; and a discharge opening disposed at a location outside the fan in a centrifugal direction, wherein said bottom plate includes an intake opening, said intake opening being defined within an area located on a discharge side of the fan unit, said area being divided into a pair of portions with a reference line extending through a rotation axis of a fan in the fan unit in a direction of discharge of the fan unit, and said intake opening further being defined in a portion located within an area opposite to the discharge side at a position upstream of the reference line according to a direction of rotation of the fan. This fan unit also serves to improve the cooling efficiency of the fan as described above.

The printed circuit board, the printed circuit board unit, and the fan unit contribute to improvement of the heat radiation from the printed circuit board.

BRIEF DESCRIPTION OF THE DRAWINGS

The above and other objects, features and advantages of the present invention will become apparent from the following description of the preferred embodiments in conjunction with the accompanying drawings, wherein:

FIGS. 7A to 7C are a table illustrating the result of an examination;

DESCRIPTION OF THE PREFERRED EMBODIMENTS

Figure 1:
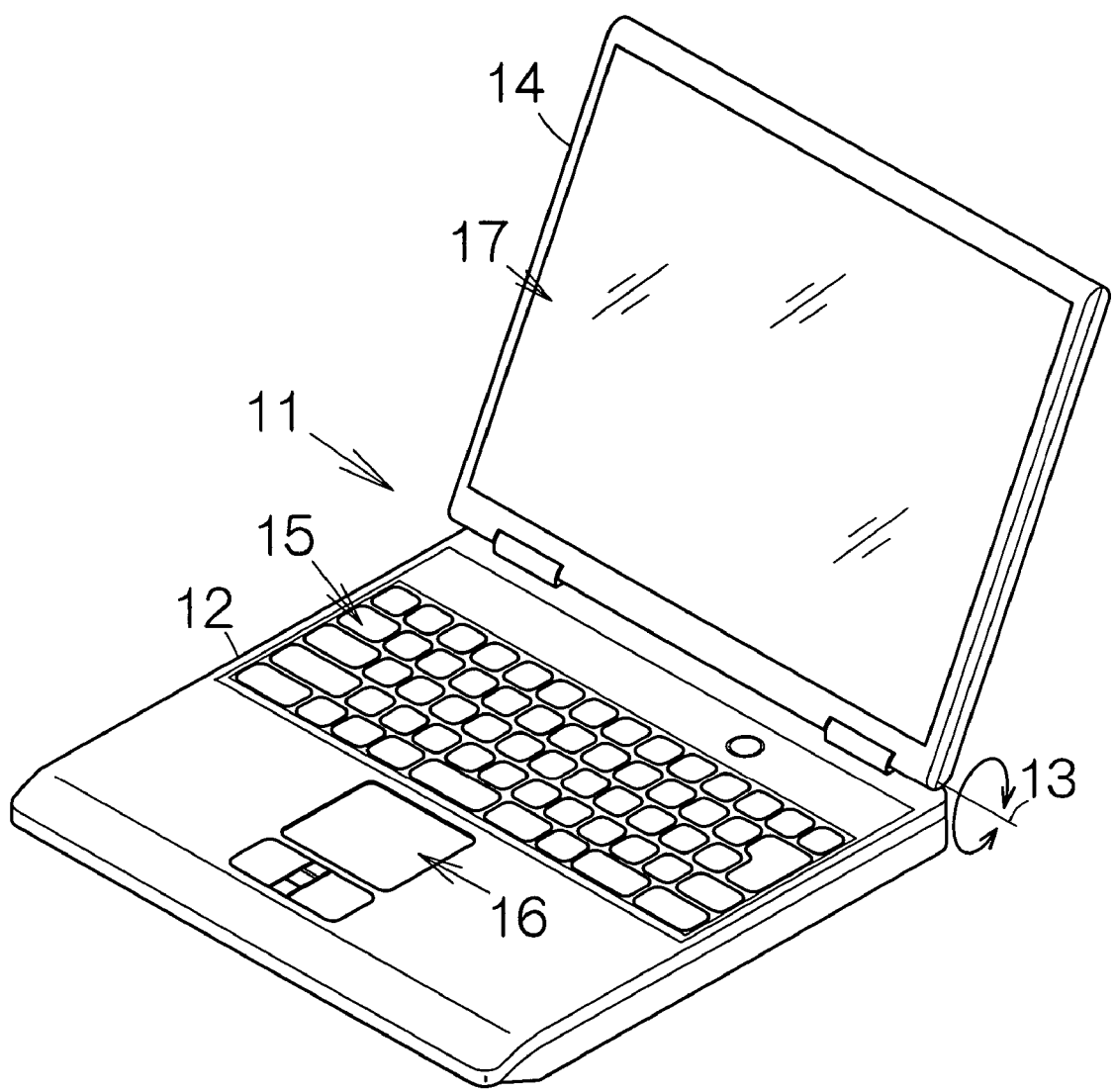
FIG. 1 is a perspective view schematically illustrating the entire structure of a notebook personal computer as an example of an electronic apparatus.

FIG. 1 schematically illustrates a notebook personal computer 11 as an example of an electronic apparatus. The notebook personal computer 11 includes a thin main body 12 and a display enclosure 14 coupled to the main body 12. The display enclosure 14 is allowed to swing around a predetermined axis 13 relative to the main body 12. Input devices such as a keyboard 15 and a pointing device 16 are embedded in the upper surface of the main body 12. A liquid crystal display (LCD) panel 17 is contained in the display enclosure 14. The user recognizes the operation of the notebook personal computer 11 based on texts and graphics displayed on the screen of the LCD panel 17, for example.

Figure 2:
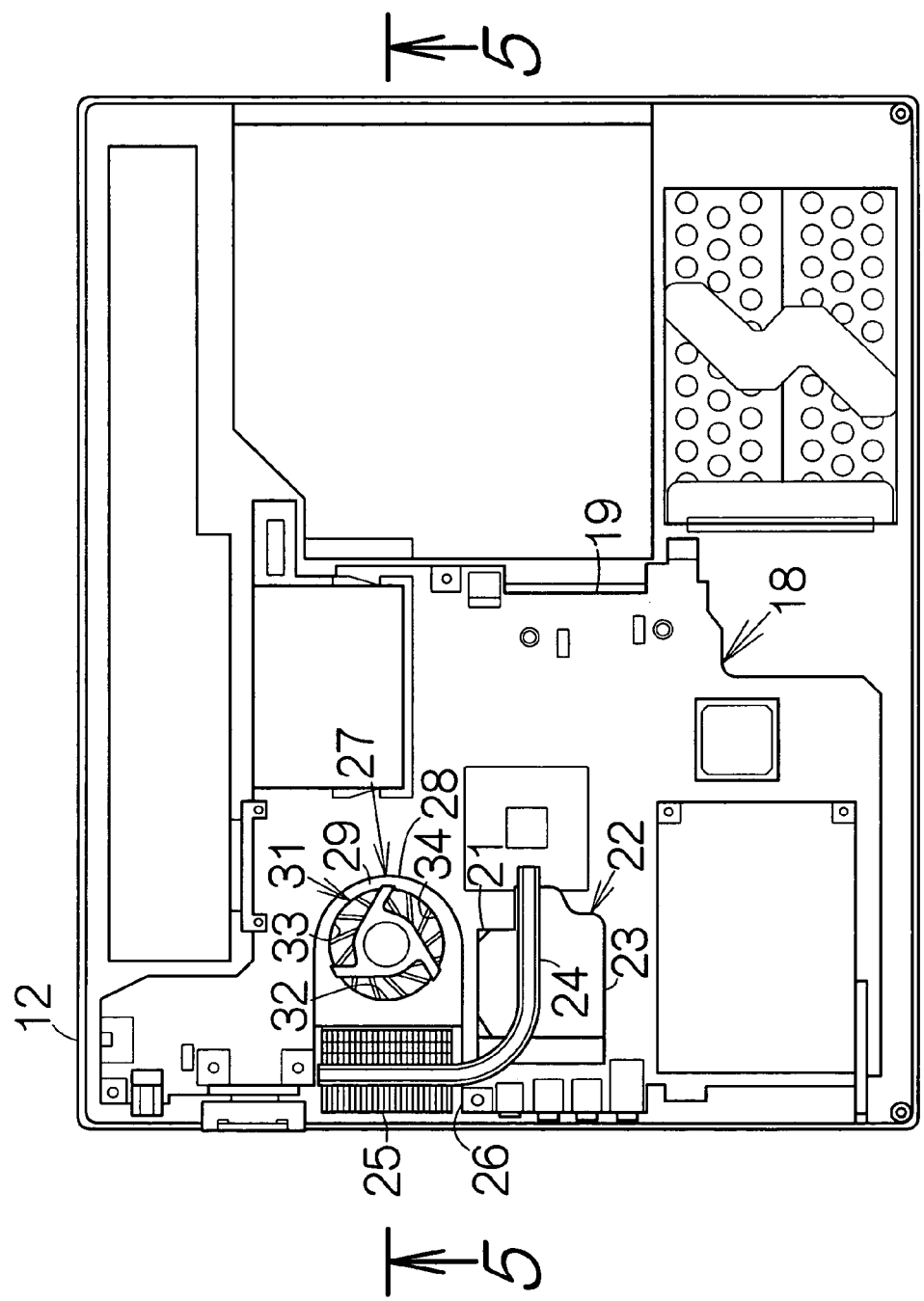
FIG. 2 is a plan view schematically illustrating the front surface of a printed circuit board unit within a main body of the notebook personal computer.

As shown in FIG. 2, a printed circuit board unit 18 is incorporated within the main body 12. The printed circuit board unit 18 includes a printed circuit board 19 and a central processing unit (CPU) package 21 mounted on the front surface of the printed circuit board 19, for example. The CPU package 21 may include a CPU chip, not shown, mounted on a small-sized ceramic substrate, for example. The CPU chip is designed to execute operations based on an operating system (OS) and application softwares, for example. The user is allowed to input various data and instructions through the input devices 15, 16 to the CPU chip.

A cooling device 22 is connected to the CPU package 21. The cooling device 22 includes a thermally-conductive plate 23 superposed on the upper surface of the CPU chip. The thermally-conductive plate 23 is connected to one end of a thermally-conductive member such as a heat pipe 24. The other end of the heat pipe 24 is connected to radiation fins 25. The radiation fins 25 are supported on the heat pipe 24. Heat of the CPU chip is transmitted to the radiation fins 25 through the thermally-conductive plate 23 and the heat pipe 24. The radiation fins 25 are designed to protrude out of the back of the printed circuit board 19 through a recess 26 defined in the edge of the printed circuit board 19.

A fan unit 27 is further mounted on the front surface of the printed circuit board 19. The fan unit 27 includes a fan cover 28 fixed to the front surface of the printed circuit board 19. The fan cover 28 defines an inner space between the printed circuit board 19 and the fan cover 28 itself. A ceiling wall 29 is defined in the fan cover 28. The ceiling wall 29 is designed to extend along a datum plane parallel to the front surface of the printed circuit board 19. An intake opening 31 is defined in the ceiling wall 29. The intake opening 31 serves to connect the inner space of the fan cover 28 and the exterior space of the fan cover 28 to each other. The intake opening 31 comprises three separate components 32, 33, 34, in this case.

Figure 3:
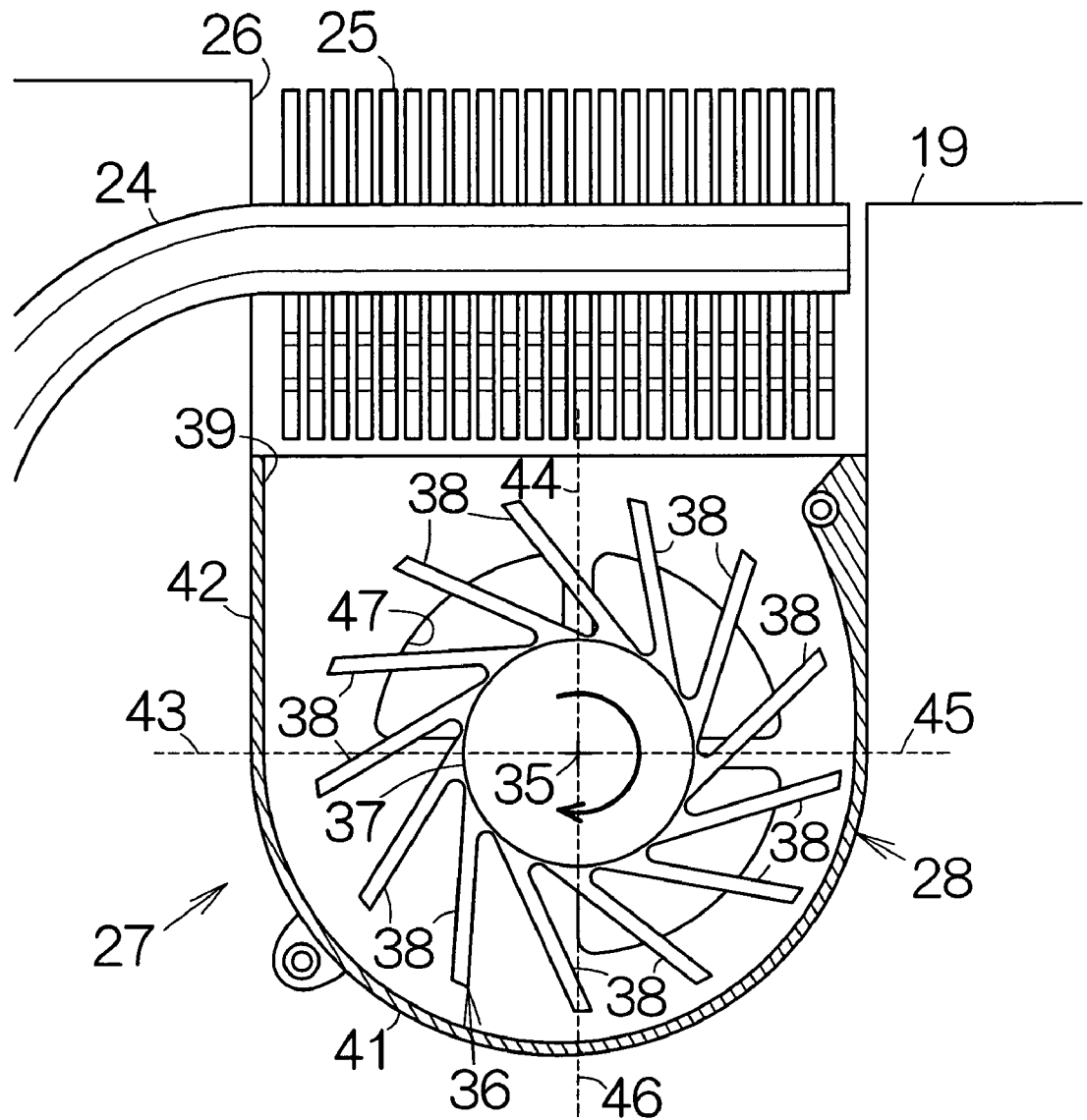
FIG. 3 is an enlarged plan view of the printed circuit board unit for schematically illustrating the main portion of the printed circuit board unit according to the present invention.

As shown in FIG. 3, a fan 36 is incorporated within the inner space of the fan cover 28. The fan 36 is designed to rotate around the rotation axis 35 perpendicular to the front surface of the printed circuit board 19. The fan 36 includes a rotary member 37 and blades 38 respectively extending in radial directions from the rotary member 37. The blades 38 are designed to extend along imaginary planes parallel to the rotation axis 35. The blades 38 are integral to the rotary member 37. The blades 38 may be arranged at equal intervals, for example, around the rotary member 37. When the rotary member 37 rotates, the blades serve to force air to flow in the centrifugal direction from the rotation axis 35. The rotary member 37 and the blades 38 in combination establish a so-called centrifugal fan.

A discharge opening 39 is defined in the fan cover 28. The discharge opening 39 is located outside the fan 36 in the centrifugal direction. The discharge opening 39 is opposed to the radiation fins 25. A curved wall 41 is also defined in the fan cover 28 so as to extend on the printed circuit board 19. The curved wall 41 stands upright on the front surface of the printed circuit board 19 outside the fan 36 in the centrifugal direction. The curved wall 41 curves along the outer periphery of the fan 36. It should be noted that the curved wall 41 may at least define a curved "surface" along the outer periphery of the fan 36. The upper end of the curved wall 41 is connected to the ceiling wall 29.

A guiding wall 42 is defined in the fan cover 28. The guiding wall 42 is designed to extend along an imaginary plane upright to the front surface of the printed circuit board 19. The guiding wall 42 extends from the downstream end of the curved wall 41 toward the discharge opening 39. The guiding wall 42 is designed to stand upright on the front surface of the printed circuit board 19 outside the fan 36 in the centrifugal direction. The inner surface of the guiding wall 42 is opposed to the outer ends of the blades 38. It should be noted that the guiding wall 42 may at least define a flat inner "surface" along the imaginary plane. The upper end of the guiding wall 42 is connected to the ceiling wall 29.

A first reference plane 43 is established in the inner space of the fan cover 28. The first reference plane 43 extends from the rotation axis toward the guiding wall 42. The first reference plane 43 perpendicularly intersects the guiding wall 42. A second reference plane 44 is likewise defined downstream of the first reference plane. The term "downstream" and "upstream" should be defined based on the direction of the rotation of the fan 36. The second reference plane 44 intersects the first reference plane 43 at the rotation axis 35 in the direction perpendicular to the first reference plane 43. A third reference plane 45 is likewise defined downstream of the second reference plane 44. The third reference plane 45 intersects the second reference plane 44 at the rotation axis 35 in the direction perpendicular to the second reference plane 44. A fourth reference plane 46 is also defined downstream of the third reference plane 45. The fourth reference plane 46 intersects the third reference plane 45 at the rotation axis 35 in the direction perpendicular to the third reference plane 45.

An intake opening 47 is defined in the printed circuit board 19 inside the curved wall 41 and the guiding wall 42. The intake opening 47 is located at a position where the fan unit 27 is mounted. The intake opening 47 serves to connect the inner space of the fan cover 28 and the exterior space of the fan cover 28 to each other. The intake opening 47 is designed to extend downstream from the first reference plane 43 to the fourth reference plane 46 across the second and third reference planes 44, 45. The intake opening 47 is opposed to a space occupied at least by the blades 38 of the rotating fan 36.

Figure 4:
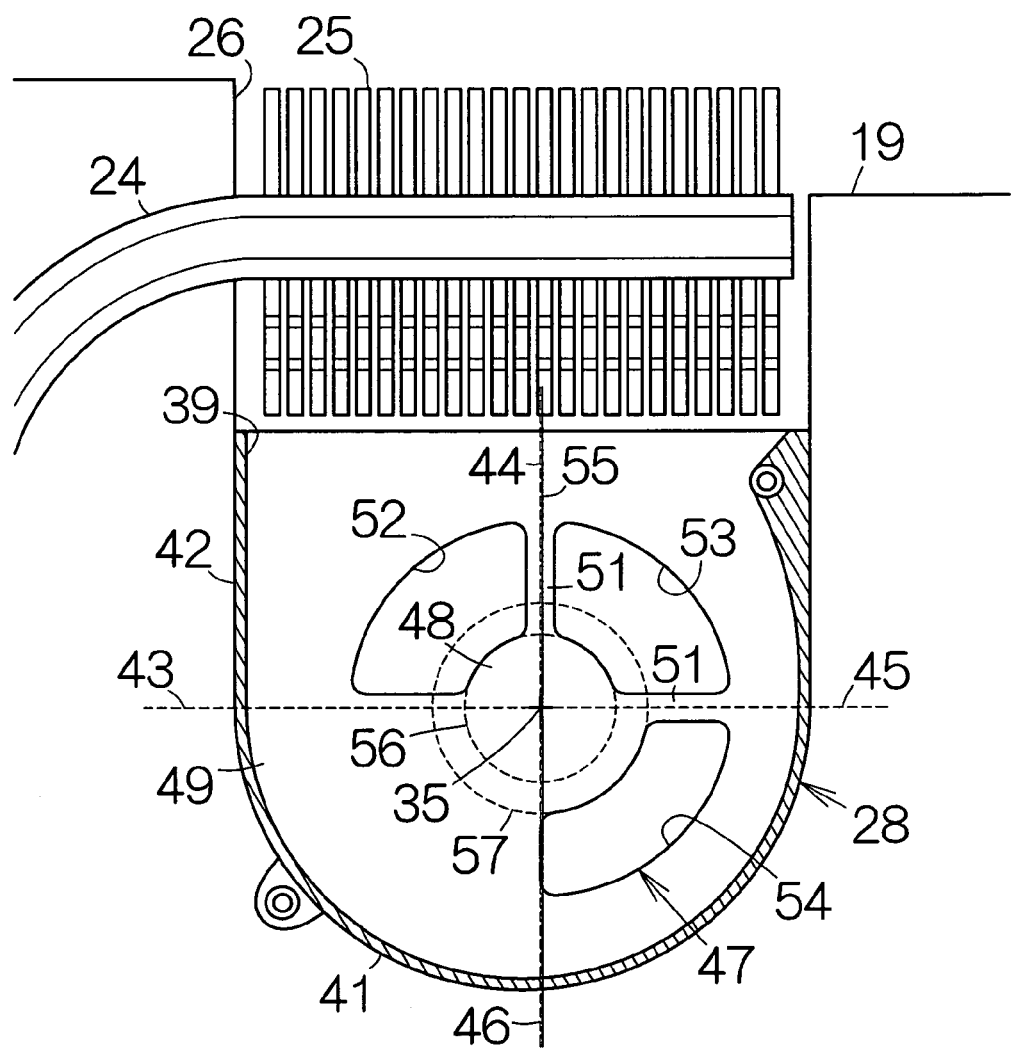
FIG. 4 is an enlarged plan view of a printed circuit board of the printed circuit board unit for schematically illustrating the structure of an intake opening.

AS shown in FIG. 4, a central portion 48 is defined in the printed circuit board 19. The central portion 48 extends around the rotation axis 35 of the fan 36 inside the intake opening 47. The rotary member 37 of the fan 36 is opposed to the central portion 48. A continuous wall or portion 49 is defined in the printed circuit board 19. The continuous portion 49 extends from the central portion 48 toward the curved wall 41 between the fourth and first reference planes 46, 43. An intake opening is excluded from the continuous portion 49. The continuous portion 49 is continuously opposed to the space occupied at least by the blades 38 of the rotating fan 36 between the fourth and first reference planes 46, 43.

Reinforcing portions 51 are formed in the intake opening 47. The reinforcing portions 51 are designed to reinforce the central portion 48. The reinforcing portions 51 extend from the central portion 48 in the centrifugal directions of the fan 36. One of the reinforcing portions 51 is formed to extend along the second reference plane 44. The other of the reinforcing portions 51 is formed to extend along the third reference plane 45. The reinforcing portions 51 serve to establish a first partial intake opening or separate component 52 between the first and second reference planes 43, 44. A second partial intake opening or separate component 53 is established between the second and third reference planes 44, 45. A third partial intake opening or separate component 54 is likewise established between the third and fourth reference planes 45, 46. In other words, the first and second partial intake openings 52, 53 are located within an area near the discharge opening 39. Such an area is divided into partial areas with a reference line 55 extending through the rotation axis 35 of the fan 36 toward the discharge opening 39. The first and second partial intake openings 52, 53 are defined within the partial areas, respectively. The third partial intake opening 54 is located within an area remoter from the discharge opening 39, namely, opposite to the area near the discharge opening 39 with respect to the rotation axis 35. The third partial intake opening 54 is defined upstream of the reference line 55 within the area.

The first and second partial intake openings 52, 53 are shaped into a near sector having the inner contour along a first circle 56. The first circle 56 has the center at the rotation axis 35 of the fan 36. The first and second partial intake openings 52, 53 are set symmetric with respect to the second reference plane 44. The first and second partial intake openings 52, 53 are thus allowed to have the identical area. On the other hand, the third partial intake opening 54 is shaped into a near sector having the inner contour along a second circle 57. The second circle 57 is set concentric to the first circle 56 and has a diameter larger than that of the first circle 56. The third partial intake opening 54 is thus set smaller than the first or second partial intake opening 52, 53.

Figure 5:
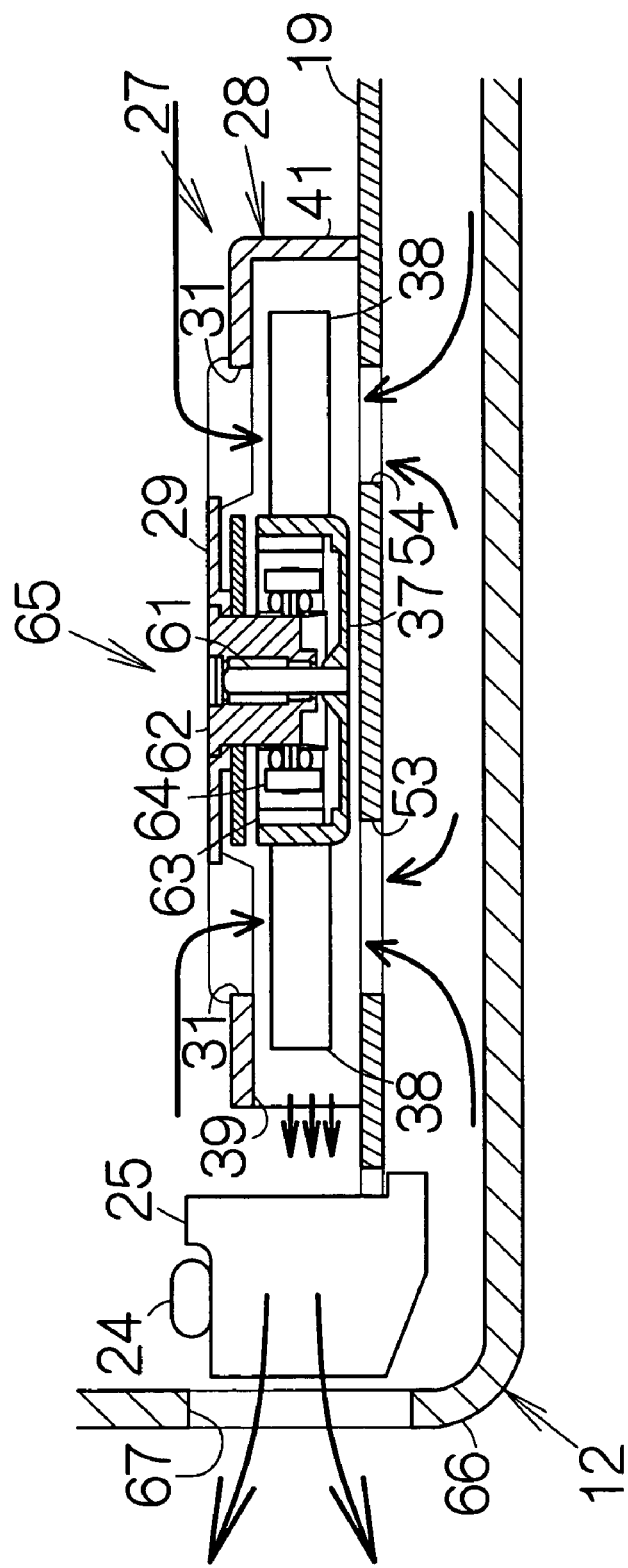
FIG. 5 is an enlarged partial sectional view taken along the line 5-5 in FIG. 2.

As shown in FIG. 5, the rotary member 37 of the fan unit 27 is mounted on a vertical rotary shaft 61 perpendicular to the front surface of the printed circuit board 19. The rotary shaft 61 is supported on a bearing 62 fixed to the ceiling wall 29 of the fan cover 28. Permanent magnets 63 are fixed to the rotary member 37. Coils 64 are attached to the bearing 62. The coils 64 are opposed to the permanent magnets 63. The rotary member 37, the rotary shaft 61 and the bearing 62 establish an electric motor 65. A controller circuit may be utilized to control the operation of the electric motor 65. The controller circuit may be mounted on a controller board, for example.

Now, when electric power is supplied to the electric motor 65, the rotary member 37 is driven to rotate around the rotation axis 35. The blades 38 force air to flow in the centrifugal direction from the rotation axis 35. The curved wall 41 and the guiding wall 42 serve to guide the air toward the discharge opening 39. The air is then discharged out of the discharge opening 39. An enclosure 66 of the main body 12 defines an opening 67 opposed to the discharge opening 39 of the fan unit 27. The air from the discharge opening 39 absorbs heat from the radiation fins 25. The air is thereafter allowed to flow out of the main body 12 through the opening 67 of the enclosure 66. The heat radiation of the radiation fins 25 is in this manner efficiently promoted.

The blades 38 on the rotating fan 36 serve to cause a high speed airflow within the inner space of the fan cover 28. Air is introduced into the fan cover 28 through the intake opening 31 as well as the first, second and third partial intake openings 52, 53, 54. Airflow is generated along the inner surface of the enclosure 66 of the main body 12. The airflow serves to efficiently absorb heat from the front and back surfaces of the printed circuit board 19. The airflow is allowed to flow out of the enclosure 66 through the discharge opening 39 and the opening 67. The heat radiation is in this manner promoted from the printed circuit board 19.

Moreover, the intake opening 47 extends from the first reference plane 43 to the fourth reference plane 46 across the second and third reference planes 44, 45. Since any intake opening is excluded from the area ranging downstream from the fourth reference plane 46 to the first reference planes 43, electronic components and/or wiring patterns can be located on the front and back surfaces of the printed circuit board 19 within the area, for example. Electronic components and/or wiring patterns can be located on the printed circuit board 19 at a higher density. It should be noted that a small-sized through via, not shown, can be formed in the printed circuit board 19 around the fan 36. The via should have a diameter small enough to avoid hindrance to introduction of air into the fan cover 28.

Figure 6A:
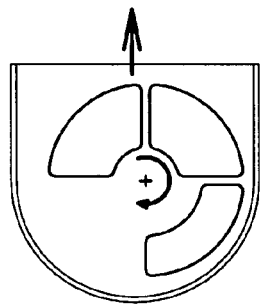
FIGS. 6A to 6L are a plan view illustrating samples of the intake opening.
Figure 6B:
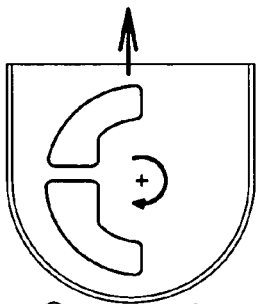
Figure 6C:
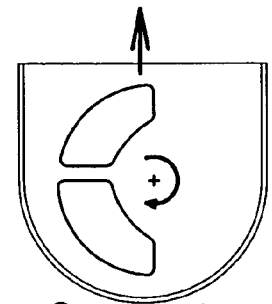
Figure 6D:
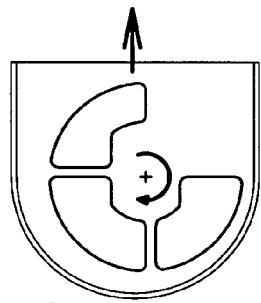
Figure 6E:
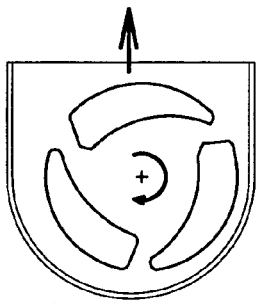
Figure 6F:
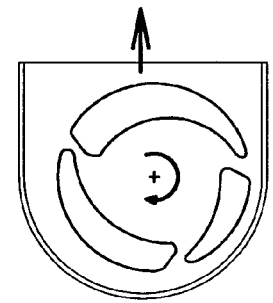
Figure 6G:
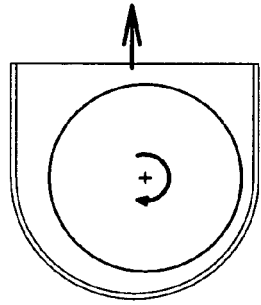
Figure 6H:
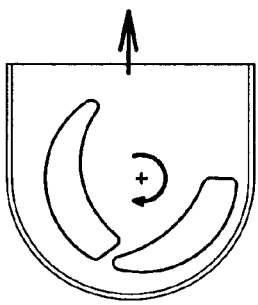
Figure 6I:
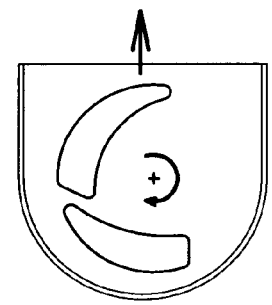
Figure 6J:
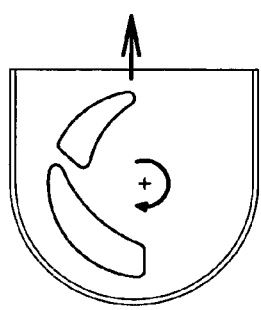
Figure 6K:
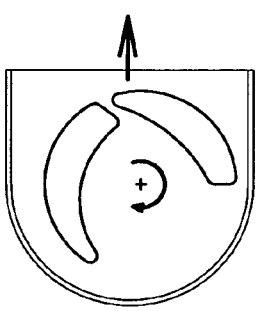
Figure 6L:
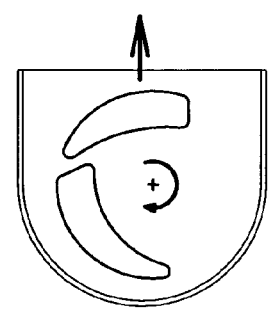

The inventors have examined the effect of the first, second and third partial intake openings 52, 53, 54. The inventors have prepared the printed circuit board unit 18 as a specific example of the present invention, as shown in FIG. 6A. The inventors also prepared various printed circuit board units according to comparative examples. The printed circuit board units were not assembled within the main body 12 during the examination. Various types of intake openings were established in the printed circuit board units of the comparative examples, as shown in FIGS. 6B to 6L. Air was discharged in the direction of the bold arrows. An air measurement apparatus was set at the discharge opening in the printed circuit board unit under the examination. The measurement apparatus was utilized to measure the maximum volume [$m^3$/min] of the discharged air and the maximum static pressure [Pa] of the discharge air during the rotation of the fan. A sound level meter was also set in the vicinity of the printed circuit board unit under the examination. The sound level meter was utilized to measure the loudness [dB] of the rotating fan.

As shown in FIGS. 7A to 7C, the printed circuit board unit 18 according to the Example of the Invention exhibits the maximum volume of the displacement nearly identical to those of the printed circuit board units of the comparative Examples Nos. 4-6. However, the printed circuit board units of the comparative Examples Nos. 4-6 were designed to define the intake opening extending from the first reference plane to the first reference plane across the second to fourth reference planes, namely, all around the rotation axis. The printed circuit board units of the comparative Examples Nos. 4-6 suffer from a smaller space for disposition of electronic components and/or wiring patterns. Additionally, the printed circuit board units of the comparative Examples Nos. 4-6 tend to suffer from a larger noise. The printed circuit board unit 18 of the Invention exhibits a superior maximum volume of the displacement to the comparative Examples Nos. 1-3 and 7-11. Although the comparative Examples Nos. 1-3 and 7-11 were designed to enjoy a larger space for electronic components and/or wiring patterns on the printed circuit board, they cannot enjoy a sufficient maximum volume of the displacement. It has been confirmed that the printed circuit board unit 18 of the Invention ensures a large space for disposition of electronic components and/or wiring patterns on the printed circuit board 19 while the printed circuit board unit 18 serves to improve the cooling efficiency of the fan 36.

Figure 8:
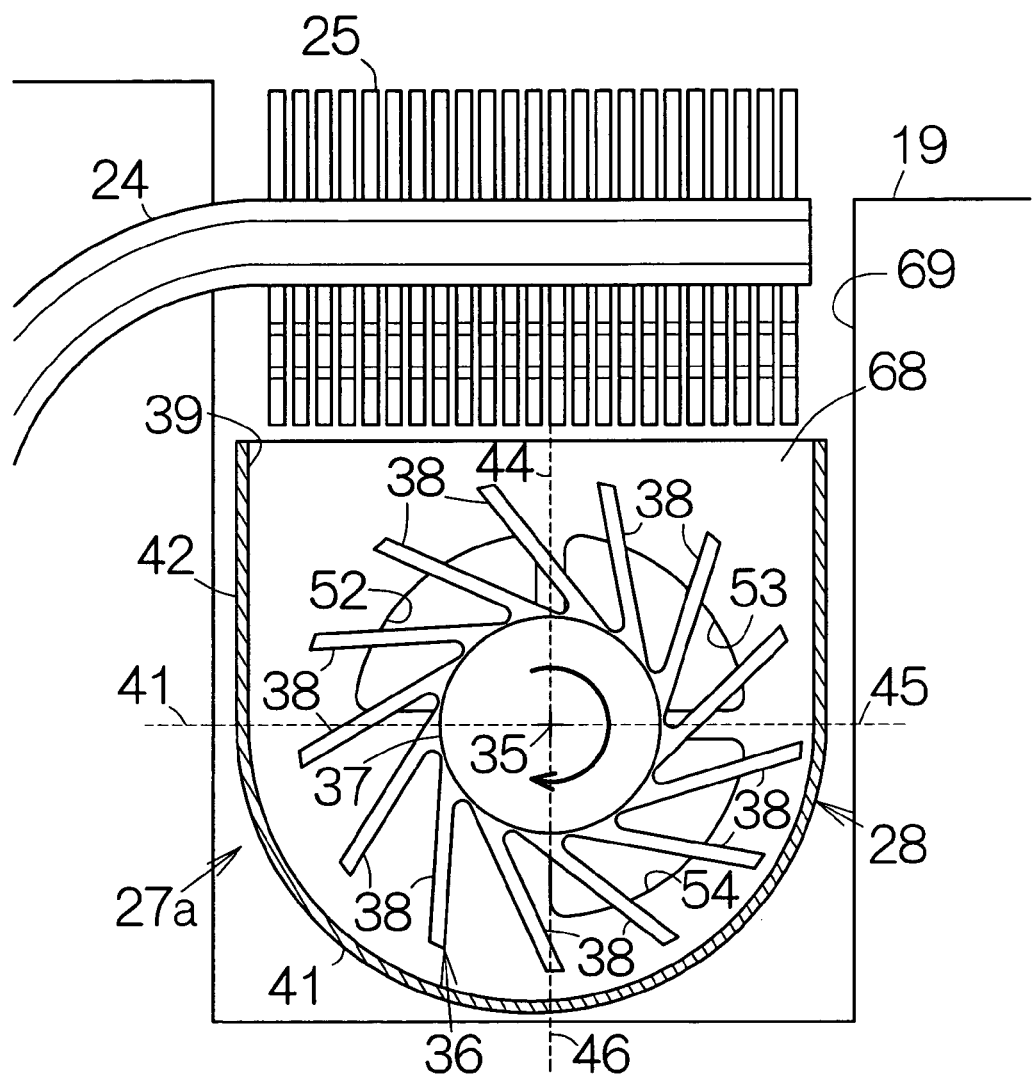
FIG. 8 is an enlarged plan view of a printed circuit board unit for schematically illustrating the main portion of a fan unit according to another example of the present invention.

As shown in FIG. 8, the fan cover 28 may be mounted on a predetermined bottom plate 68 in place of the aforementioned printed circuit board 19 in the printed circuit board unit 18. The first, second and third partial intake openings 52, 53, 54 may be defined in the bottom plate 68. The fan unit 27*a* of the type may be located within a recess 69 formed in the printed circuit board 19, for example. The fan unit 27*a* may be fixed to the enclosure 66 of the main body 12, for example. Like reference numerals are attached to components or structures equivalent to those of the aforementioned embodiment.

Figure 9:
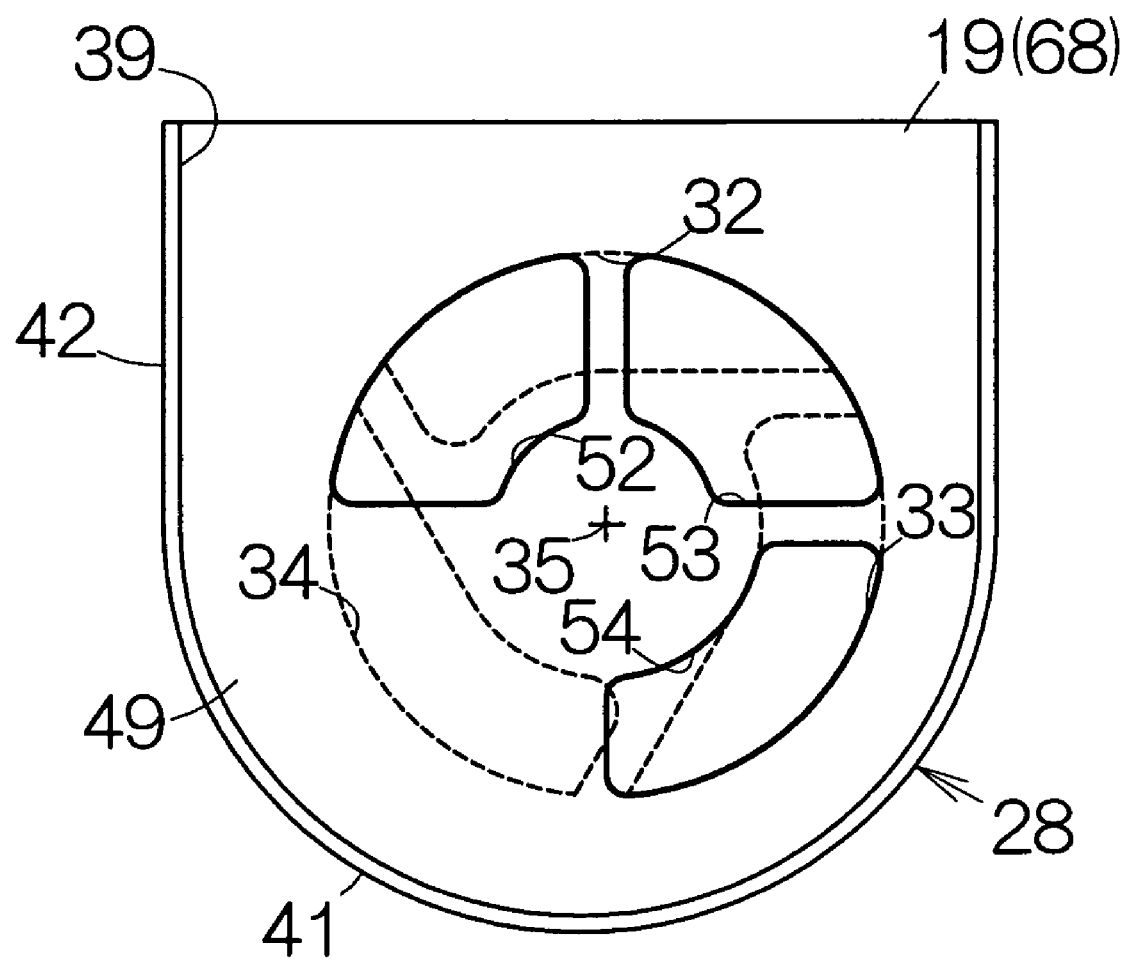
FIG. 9 is an enlarged plan view illustrating the positional relationship between the intake opening in the ceiling wall of the fan cover and the intake opening in the printed circuit board or bottom plate of the fan cover.

FIG. 9 illustrates the positional relationship between the intake openings 32, 33, 34 at the ceiling wall 29 of the fan cover 28 and the partial intake openings 52, 53, 54 at the printed circuit board 19 in the printed circuit board unit 18. It should be noted that the identical positional relationship may be established between the intake openings 32, 33, 34 and the partial intake openings 52, 53, 54 at the bottom plate 62 of the fan unit 27*a*.

Assume that the intake openings 32, 33, 34 are projected on the front surface of the printed circuit board 19 in the direction perpendicular to the front surface of the printed circuit board 19. The intake openings 32, 33 are superposed over the partial intake openings 52, 53, 54. The intake opening 34 is superposed over the area 49 excluding an intake opening. A small part of the intake opening 34 is also superposed on the partial intake opening 52.

The outer radius of the first, second and third partial openings 52, 53, 54 may be set at 15 mm approximately, for example, around the rotation axis 35. The outer radius of the intake openings 32, 33, 34 may also be set at 15 mm approximately around the rotation axis 35. The inner radius of the first and second partial intake openings 52, 53 may be different from that of the third partial intake opening 54. The first and second partial intake openings 52, 53 may have a radius of 6 mm while the third partial intake opening 54 may have a radius of 9 mm, for example.

The aforementioned printed circuit board units 18 and the fan units 27, 27*a* may be incorporated not only in a portable electronic apparatus such as the aforementioned notebook personal computer 11 and a personal digital assistance (PDA) but also in a floor model or desktop model of an electronic apparatus.

What is claimed is:

1. A printed circuit board unit comprising:
a printed circuit board having a top surface having a region;
a fan rotating in a predetermined rotational direction about a rotational axis intersecting with the top surface, to generate a blow; and
a fan cover mounted on the region, the fan being disposed in the fan cover, the fan cover having a wall surrounding the fan, the wall having a discharge opening to discharge the blow generated by the fan;
wherein the region mounting the fan cover comprises a first reference plane, a second reference plane, a third reference plane and a fourth reference plane, each starting from the rotational axis to a radially outward direction of the rotational axis, in order corresponding to the predetermined rotational direction, the first reference plane being opposed to the third reference plane, the second reference plane being opposed to the fourth reference plane, the first and third reference planes perpendicularly intersecting with the second and fourth reference planes, the second reference plane corresponding to the direction from the rotational axis toward the discharge opening,
wherein the region mounting the fan cover further comprises: a first area ranging between the first reference plane and the second reference plane; a second area ranging between the second reference plane and the third reference plane; a third area ranging between the third reference plane and the fourth reference plane; and a fourth area ranging between the fourth reference plane and the first reference plane,
wherein the printed circuit board further comprises an intake opening formed in the first area, second area and third area, and wherein the intake opening is not formed in the fourth area.

2. The printed circuit board unit according to claim 1, wherein the intake opening is formed in parts of the first, second and third areas, and is not formed in a central portion included in the first, second and third areas, the central portion including the rotation axis.

3. The printed circuit board unit according to claim 1, wherein the fourth area is opposed to blades of the fan.

4. An electronic apparatus comprising the printed circuit board unit according to claim 1.

5. The printed circuit board unit according to claim 1, wherein the fan generates the blow in the radially outward direction of the rotation axis.

6. The printed circuit board unit according to claim 2, wherein the central portion in the first and second areas is half-circle shaped with a first diameter having center thereof at the rotation axis, the central portion in the third area is quarter-circle shaped with a second diameter having center thereof at the rotation axis, wherein the first diameter is smaller than the second diameter.

7. The printed circuit board unit according to claim 1, wherein the first, second and third intake openings are sector-like shaped.

8. A printed circuit board unit comprising:
a printed circuit board having a top surface having a region;
a fan rotating in a predetermined rotational direction about a rotational axis intersecting with the top surface, to generate a blow;
a fan cover mounted on the region, the fan being disposed in the fan cover, the fan cover having a wall surrounding the fan, the wall having a discharge opening to discharge the blow generated by the fan; and
wherein the region mounting the fan cover comprises a first reference plane, a second reference plane, a third reference plane and a fourth reference plane, each starting from the rotational axis to a radially outward direction of the rotational axis, in order corresponding to the predetermined rotation direction, the first reference plane being opposed to the third reference plane, the second reference plane being opposed to the fourth reference plane, the first and third reference planes perpendicularly intersecting with the second and fourth reference planes, the second reference plane corresponding to the direction from the rotation axis toward the discharge opening, wherein the region mounting the fan cover further comprises: a first area ranging between the first reference plane and the second reference plane; a second area ranging between the second reference plane and the third reference plane; a third area ranging between the third reference plane and the fourth reference plane; and a fourth area ranging between the fourth reference plane and the first reference plane, wherein the printed circuit board further comprises: a first intake opening formed in the first area; a second intake opening formed in the second area; and a third intake opening formed in the third area, and wherein there is no intake opening in the fourth area.

9. The printed circuit board unit according to claim 8, wherein the first intake opening is formed in a part of the first area, the second intake opening is formed in a part of the second area, and the third intake opening is formed in a part of the third areas, wherein there is no intake opening in a central portion included in the first, second and third areas, the central portion including the rotation axis.

10. The printed circuit board unit according to claim 8, wherein the fourth area is opposed to blades of the fan.

11. An electronic apparatus comprising the printed circuit board unit according to claim 8.

12. The printed circuit board unit according to claim 9, wherein the central portion in the first and second areas is wholly half-circle shaped with a first diameter having center thereof at the rotation axis, the central portion in the third area is quarter-circle shaped with a second diameter having center thereof at the rotational axis, wherein the first diameter is smaller than the second diameter.

13. The printed circuit board unit according to claim 8, wherein the fan generates the blow in the radially outward direction of the rotation axis.

14. A fan unit comprising:
a bottom plate having a top surface having a region;
a fan rotating in a predetermined rotational direction about a rotational axis intersecting with the top surface, to generate a blow; and
a fan cover coupled to the bottom plate, the fan being disposed in the fan cover, the fan cover having a wall surrounding the fan, the wall having a discharge opening to discharge the blow generated by the fan;
wherein the region comprises a first reference plane, a second reference plane, a third reference plane and a fourth reference plane, each starting from the rotational axis to a radially outward direction of the rotational axis, in order corresponding to the predetermined rotational direction, the first reference plane being opposed to the third reference plane, the second reference plane being opposed to the fourth reference plane, the first and third reference planes perpendicularly intersecting with the second and fourth reference planes, the second reference plane corresponding to the direction from the rotation axis toward the discharge opening,
wherein the region further comprises: a first area ranging between the first reference plane and the second reference plane; a second area ranging between the second reference plane and the third reference plane; a third area ranging between the third reference plane and the fourth reference plane; and a fourth area ranging between the fourth reference plane and the first reference plane,
wherein the bottom plate further comprises an intake opening formed in the first, second and third areas, and wherein the intake opening is not formed in the fourth area.

15. The fan unit according to claim 14, wherein the intake opening is formed in parts of the first, second and third areas, and is not formed in a central portion included in the first, second and third areas, the central portion including the rotation axis.

16. The fan unit according to claim 14, wherein the fourth area is opposed to blades of the fan.

17. The fan unit according to claim 14, wherein the fan generates the blow in the radially outward direction of the rotation axis.

18. The fan unit according to claim 15, wherein the central portion in the first and second areas is wholly half-circle shaped with a first diameter having center thereof at the rotation axis, the central portion in the third area is quarter-circle shaped with a second diameter having center thereof at the rotation axis, wherein the first diameter is smaller than the second diameter.

19. The fan unit according to claim 14, wherein the first, second and third intake openings are sector-like shaped.

20. A fan unit comprising:
a bottom plate having a top surface having a region;
a fan rotating in a predetermined rotational direction about a rotational axis intersecting with the top surface, to generate a blow; and
a fan cover coupled to the region, the fan being disposed in the fan cover, the fan cover having a wall surrounding the fan, the wall having a discharge opening to discharge the blow generated by the fan;
wherein the region mounting the fan cover comprises a first reference plane, a second reference plane, a third reference plane and a fourth reference plane, each starting from the rotational axis to a radially outward direction of the rotational axis, in order corresponding to the predetermined rotational direction, the first reference plane being opposed to the third reference plane, the second reference plane being opposed to the fourth reference plane, the first and third reference planes perpendicularly intersecting with the second and fourth reference planes, the second reference plane corresponding to the direction from the rotation axis toward the discharge opening,
wherein the region further comprises: a first area ranging between the first reference plane and the second reference plane; a second area ranging between the second reference plane and the third reference plane; a third area ranging between the third reference plane and the fourth reference plane; and a fourth area ranging between the fourth reference plane and the first reference plane,
wherein the bottom plate further comprises: a first intake opening formed in the first area; a second intake opening formed in the second area; and a third intake opening formed in the third area, and wherein there is no intake opening in the fourth area.

21. The fan unit according to claim 20, wherein the first intake opening is formed in a part of the first area, the second intake opening is formed in a part of the second area, and the third intake opening is formed in a part of the third areas, wherein there is no intake opening in a central portion included in the first, second and third areas, the central portion including the rotational axis.

22. The fan unit according to claim 20, wherein the fan generates the blow in the radially outward direction of the rotation axis.

23. The fan unit according to claim 21, wherein the central portion in the first and second areas is wholly half-circle shaped with a first diameter having center thereof at the rotation axis, the central portion in the third area is quarter-circle shaped with a second diameter having center thereof at the rotation axis, wherein the first diameter is smaller than the second diameter.

24. The fan unit according to claim 20, wherein the first, second and third intake openings are sector-like shaped.

* * * * *